United States Patent [19]

Takeuchi et al.

[11] Patent Number: 5,225,692
[45] Date of Patent: Jul. 6, 1993

[54] NON-LINEAR QUANTUM SEMICONDUCTOR OPTICAL DEVICE HAVING A SIGNAL-TO-NOISE RATIO

[75] Inventors: Atsushi Takeuchi; Hideaki Ishikawa; Shunichi Muto, all of Kawasaki, Japan

[73] Assignee: Fujitsu Limited, Kawasaki, Japan

[21] Appl. No.: 858,132

[22] Filed: Mar. 27, 1992

[30] Foreign Application Priority Data

Mar. 27, 1991 [JP] Japan .................. 3-63385

[51] Int. Cl.⁵ .......................................... H01L 27/14
[52] U.S. Cl. ........................................ 257/17; 257/21; 257/25; 257/22; 257/23; 372/45; 372/46; 359/248
[58] Field of Search ............... 257/21, 22, 17, 25, 257/18, 23; 372/50, 46, 45; 359/260, 248

[56] References Cited

U.S. PATENT DOCUMENTS

| | | | |
|---|---|---|---|
| 4,665,412 | 5/1987 | Ohkawa et al. | 257/17 |
| 4,720,309 | 1/1988 | Deveaud et al. | 372/11 X |
| 4,819,036 | 4/1989 | Kuroda et al. | 257/21 X |
| 5,023,879 | 6/1991 | Wang et al. | 372/45 X |
| 5,113,231 | 5/1992 | Söderström | 257/25 |
| 5,136,345 | 8/1992 | Kasahara | 372/45 X |

FOREIGN PATENT DOCUMENTS

| | | |
|---|---|---|
| 0358229 | 3/1990 | European Pat. Off. |
| 0462042 | 12/1991 | European Pat. Off. |
| 2589630 | 5/1987 | France |

OTHER PUBLICATIONS

Feldman et al., "Experimental study of the Γ-X electron transfer in type-II (Al,Ga)As/AlAs superlattices and multiple-quantum-well structures," Physical Review B, vol. 42, No. 9, Sep., 1990, New York, N.Y., pp. 5809-5821.

*Primary Examiner*—William Mintel
*Attorney, Agent, or Firm*—Staas & Halsey

[57] ABSTRACT

A non-linear semiconductor optical device comprises a first quantum well layer having discrete quantum levels of carriers including a first quantum level for electrons and a second quantum level for holes with an energy gap corresponding to a wavelength of an incident optical beam; a pair of barrier layers provided above and below the first quantum well layer in contact therewith with a thickness that allows a tunneling of the carriers therethrough for defining a potential well in correspondence to the first quantum well layer; and a second quantum well layer provided in contact with the barrier layers for accepting the carriers that have been created in the first quantum well layer upon excitation by the incident optical beam and escaped therefrom by tunneling through the barrier layer. The second quantum well layer comprises a material that has a conduction band including therein a Γ valley and an X valley, wherein said Γ valley is located at an energy level substantially higher than the first quantum level while said X valley is located at an energy level substantially lower than the first quantum level.

14 Claims, 21 Drawing Sheets

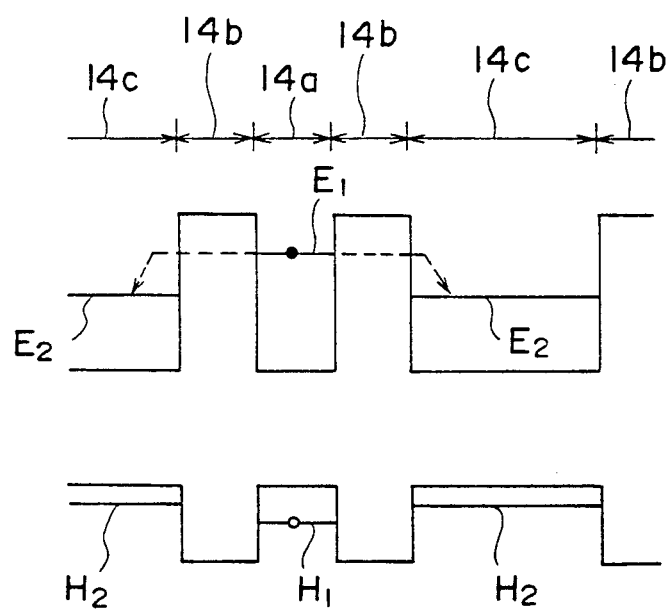
FIG. I PRIOR ART

GaAs

AlAs

NON-LINEAR QUANTUM SEMICONDUCTOR OPTICAL DEVICE HAVING A SIGNAL-TO-NOISE RATIO

BACKGROUND OF THE INVENTION

The present invention generally relates to semiconductor devices and more particularly to a semiconductor optical device that shows a non-linear optical response.

In relation to the high-speed optical telecommunication systems and optical digital processors, the non-linear semiconductor optical devices are studied intensively. In the non-linear semiconductor optical devices, the optical property such as the transmittance or reflectance is changed in response to the irradiation of a control optical beam. Thus, the device is suitable for constructing optically triggered optical switches, optical logic processors or optical modulators.

In the Laid-open European patent application EP 0 358 229 and in the corresponding U.S. patent application Ser. No. 404,958 as well as in the U.S. patent application Ser. No. 758,857 that is a CIP application of the foregoing Ser. No. 404,958, the inventors of the present invention have proposed a so-called TBQ (tunneling bi-quantum well) structure for the non-linear semiconductor optical device.

In the TBQ structure, a quantum well layer is provided together with a pair of barrier layers for forming discrete quantum levels such that the carriers are excited to the quantum levels upon interaction with an incident optical beam. In response to the excitation, the incident optical beam is absorbed by the quantum well layer. In order to accelerate the recovery of the original optical state after interruption of the incident optical beam, the TBQ structure uses a second quantum well layer adjacent to the barrier layer with a quantum level formed at a level lower than the quantum level of the first mentioned quantum well. Further, the thickness of the barrier layer is set small enough such that the carriers, particularly the electrons, can cause a tunneling through the barrier layer. Thereby, the free electrons that are excited in the first quantum well layer upon absorption of the incident optical beam immediately escape to the second quantum well layer, and the quick recovery of the original optical state such as the original optical absorption or original refractive index is guaranteed.

FIG. 1 shows the band structure of a conventional TBQ device.

Referring to FIG. 1, the TBQ device has an active layer 14a that is sandwiched by a pair of barrier layers 14b. The thickness of the active layer 14a is set small enough such that discrete quantum levels of electrons and holes such as $E_1$ and $H_1$ are formed therein. In other words, the active layer 14a forms a quantum well. There, the quantum well layer 14a absorbs the incident optical beam having a wavelength corresponding to the energy gap between the quantum level $E_1$ and $H_1$ by causing an excitation of the electrons to the quantum level $E_1$. Further, the incident optical beam is absorbed by creating excitons that exist at the energy level slightly lower than the quantum level $E_1$. The excitons thus produced are further decomposed by releasing electrons and holes to the quantum levels $E_1$ and $H_1$.

In the TBQ structure of FIG. 1, the thickness of the barrier layer 14b is set small enough such that the electrons and holes that are excited to the quantum level $E_1$ can escape from the quantum well layer 14a freely. Further, in order to accelerate the escaping of the electrons from the quantum well layer 14a, another quantum well layer 14c is provided adjacent to and in contact with the barrier layer 14b. Typically, the second quantum well layer 14c has a thickness substantially larger than the thickness of the first quantum well layer 14a and is characterized by quantum levels $E_2$ and $H_2$ that are substantially lower than the corresponding quantum levels $E_1$ and $H_1$ of the first quantum well layer 14a. There, the electrons escape from the first quantum well layer 14a to the second quantum well layer 14c through the barrier layer 14b and the unwanted dwelling of the carriers in the first quantum well layer 14a is avoided. It should be noted that the carriers that are dwelling on the excited state impede further absorption of the incident optical beam. In order to recover the original state after the interruption of the incident optical beam, one has to remove the excited carriers as fast as possible.

In the TBQ structure shown in FIG. 1, it should be noted that the energy gap between the quantum levels $E_2$ and $H_2$ is much smaller than the energy of the incident optical beam. Thereby, there occurs a problem in the device of FIG. 1 in that the incident optical beam is absorbed inevitably by the second quantum well layer 14c. In other words, the non-linear semiconductor optical device of FIG. 1 tends to show a relatively poor signal-to-noise ratio.

The TBQ device of FIG. 1 has another problem in that the electrons and holes that have escaped from the first quantum well layer 14a to the second quantum well layer 14c tend to dwell in the layer 14c. For example, this problem becomes conspicuous when the incident optical beam is supplied in the form of high speed optical pulses. Particularly, there is a tendency that the electrons are preferentially accumulated in the second quantum well layer 14c because of the smaller effective mass as compared with the holes. On the other hand, the holes tend to be accumulated in the first quantum well layer 14a. When this occurs, the energy level of the second quantum well layer 14c may shift gradually relative to the first quantum well layer 14a. Ultimately, the quantum level $E_2$ may become substantially identical with the quantum level $E_1$. When such a situation occurs, the removal of the carriers from the quantum well layer 14a is no longer effective and the response of the non-linear semiconductor optical device is inevitably deteriorated.

SUMMARY OF THE INVENTION

Accordingly, it is a general object of the present invention to provide a novel and useful non-linear semiconductor optical device, wherein the foregoing problems are eliminated.

Another and more specific object of the present invention is to provide a non-linear semiconductor optical device having the TBQ structure characterized by a first quantum well layer for interacting with an incident optical beam by causing an optical excitation of carriers and a second quantum well layer separated from each other by a barrier layer for absorbing the carriers that are excited in the first quantum well layer, wherein the absorption of the incident optical beam by the second quantum well layer is minimized.

Another object of the present invention is to provide a non-linear semiconductor optical device having the TBQ structure characterized by a first quantum well layer for interacting with an incident optical beam by causing an optical excitation of carriers and a second quantum well layer separated from each other by a barrier layer for absorbing the carriers that are excited in the first quantum well layer, wherein the accumulation of the carriers in the second quantum well layer is eliminated.

Another object of the present invention is to provide a non-linear semiconductor optical device for changing an optical state in response to an irradiation of an incident optical beam, comprising: a first quantum well layer having discrete quantum levels of carriers, said discrete quantum levels including a first quantum level for electrons and a second quantum level for holes, said first and second quantum levels being separated from each other by an energy gap corresponding to a wavelength of said incident optical beam; a pair of barrier layers provided above and below said first quantum well layer in contact therewith for defining a potential well in correspondence to said first quantum well layer, said barrier layers having a thickness that allows a tunneling of the carriers therethrough; and a second quantum well layer provided in contact with one of said barrier layers for accepting the carriers that have been created in said first quantum well layer upon excitation by said incident optical beam and escaped from said first quantum well layer by causing the tunneling through said barrier layer; said second quantum well layer comprising a material that has a conduction band including therein a $\Gamma$ valley and an X valley, wherein said $\Gamma$ valley is located at an energy level substantially higher than said first quantum level while said X valley is located at an energy level substantially lower than said first quantum level. According to the present invention, the problem of unwanted absorption of the incident optical beam by the second quantum well layer is effectively eliminated by choosing the material for the second quantum well layer as set forth above. It should be noted that, in the second quantum well layer, the optical excitation of electrons from the valence band to the $\Gamma$ valley of the conduction band can occur in accordance with the direct transition mechanism, provided that a sufficient optical energy is provided. As the energy needed for this transition is substantially larger than the optical energy of the incident optical beam, the absorption of the incident optical beam by the second quantum well layer does not occur. On the other hand, the electrons that have been excited to the first quantum level in the active layer can always find a place to settle, as the X valley of the conduction band of the second quantum well layer is located at an energetically lower level as compared with the first quantum level. Thus, the removal of the carriers from the active layer is achieved efficiently. Thereby, a quick recovery of the original optical state is guaranteed.

In a preferred embodiment, electrodes are provided for absorbing the electrons and holes that have been transferred to the second quantum well layer. Thereby, one can eliminate the carriers from the second quantum well layer by applying an electric field across the electrodes.

In another preferred embodiment, the material that forms the second quantum well layer is selected such that the valence band has an energy level that is smaller than the second quantum level in terms of the energy of the holes. In this embodiment, a potential well of holes is formed in the second quantum well layer and one can effectively remove the holes from the first quantum well layer, in addition to the electrons. Thereby, the recovery of the original optical state is facilitated further.

Other objects and further features of the present invention will become apparent from the following detailed description when read in conjunction with the attached drawings.

BRIEF DESCRIPTION OF THE DRAWINGS

FIG. 1 is a diagram showing the band structure of a conventional TBQ;

DETAILED DESCRIPTION OF THE PREFERRED EMBODIMENT

Before starting the description of the embodiments, a brief explanation on the principle of the present invention will be made with reference to FIG. 2(A) and 2(B) that show the band diagrams of GaAs and AlAs respectively.

Figure 2A:
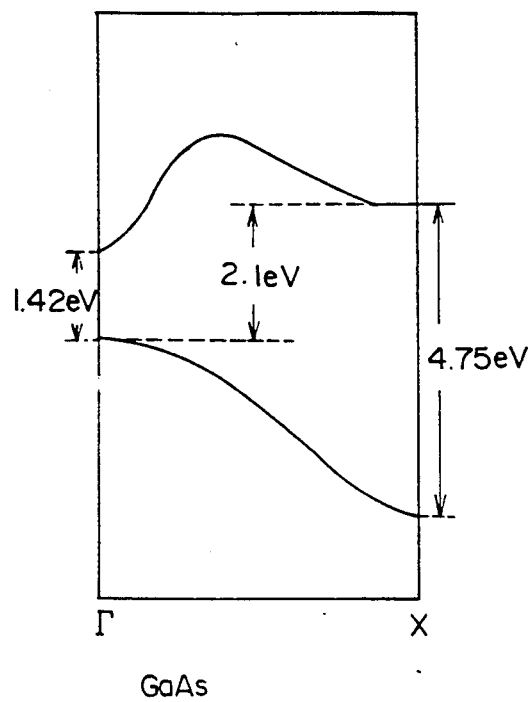
FIGS. 2(A) and 2(B) are diagrams respectively showing the $\Gamma$ point and the X point in the band diagram of GaAs and AlAs.
Figure 2B:
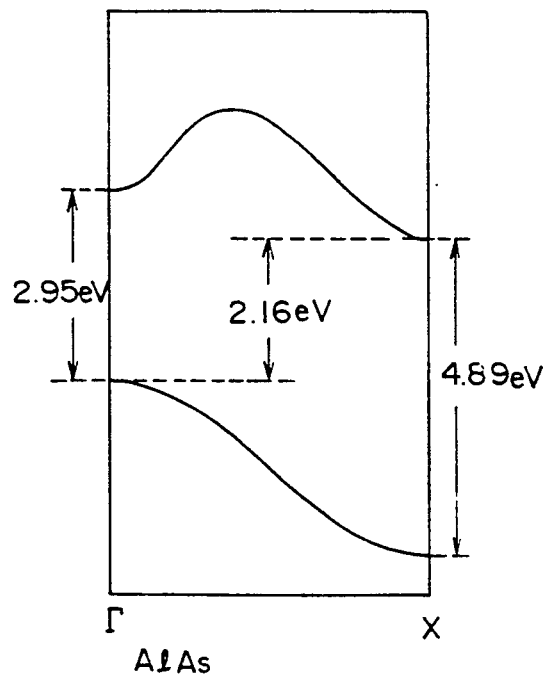

Referring to FIG. 2(A) showing the well known band structure of GaAs in the wavenumber or momentum space, it will be seen that the band edge of the conduction band and the valence band changes with the horizontal axis that represents the crystal momentum. There, the conduction band has a minimum or valley in correspondence to the $\Gamma$ point and further in correspondence to the X point, while the valence band has a corresponding maximum at the $\Gamma$ point. Further, the valence band has a valley at the X point. Thereby, the band gap of GaAs assumes a minimum gap energy of 1.42 eV in correspondence to the $\Gamma$ point, while at the X point, the gap energy assumes a maximum value of 4.75 eV. Further, the gap energy between the second minimum of the conduction band at the X point and the maximum of the conduction band at the $\Gamma$ point assumes the value of 2.1 eV.

Such a band structure of GaAs is known as the direct transition type wherein the optical excitation occurs at the $\Gamma$ point without a change of the crystal momentum. On the other hand, the optical excitation from the $\Gamma$ point of the valence band to the X point of the conduction band needs a corresponding change of the crystal momentum and occurs with a substantially reduced probability. It should be noted that such a change of the crystal momentum has to be given by other elementary processes such as the interaction with phonons having an appropriate momentum. Thereby, the probability of the indirect transition is substantially reduced. It should be noted that the optical excitation of electrons that involves a change of momentum of electrons is known as the indirect transition process.

A similar explanation holds also true for the band structure of AlAs. Thus, AlAs shows a gap energy of 2.95 eV for the direct transition at the $\Gamma$ point and another gap energy of 4.89 eV at the X point. Further, the gap energy between the X point of the conduction band and the $\Gamma$ point of the valence band is 2.16 eV. Similarly to GaAs, the optical excitation from the $\Gamma$ point of the valence band to the X point of the conduction band does not occur, as such a transition needs the indirect transition mechanism. In the band structure of AlAs, it should be noted that the bottom edge of the conduction band corresponds to the X point, while in the band structure of GaAs, the bottom edge of the conduction band corresponds to the $\Gamma$ point. Thereby, AlAs shows little optical absorption even when an optical beam having the gap energy of 2.16 eV is supplied.

The present invention eliminates the problem of unwanted absorption of the incident optical beam by the second quantum well layer of TBQ by using the material that has the band structure showing the feature of indirect transition similar to AlAs for the second quantum well layer.

Figure 3:
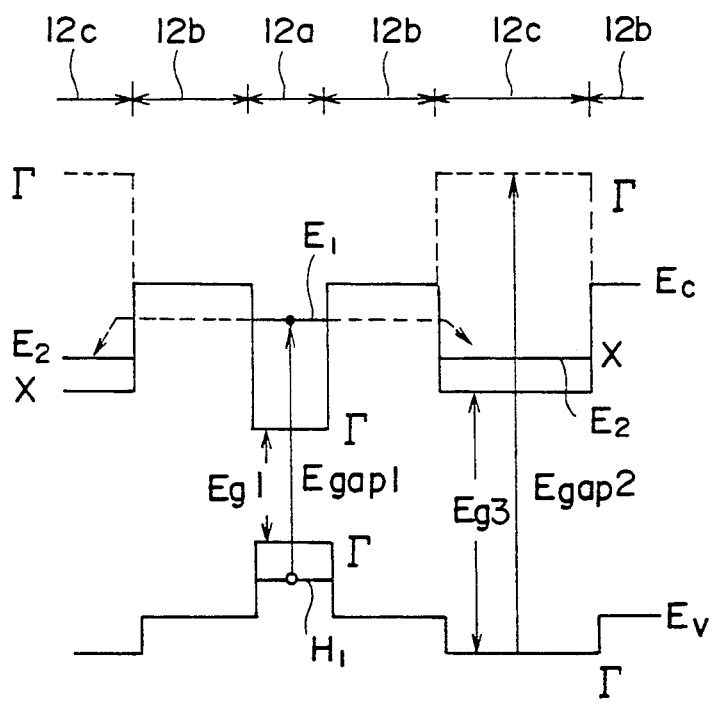
FIG. 3 is a diagram showing the band structure of a non-linear semiconductor optical device according to a first embodiment of the present invention.

FIG. 3 is a band diagram that shows the principle of the present invention.

Referring to FIG. 3, the non-linear semiconductor optical device of the present invention includes a layered body 12 that has the TBQ structure similar to the device of FIG. 1. Referring to FIG. 3, the layered body 12 includes a first quantum well layer 12a of GaAs that corresponds to the quantum well layer 14a of FIG. 1. The layer 12a is sandwiched by a pair of barrier layers 12b of AlGaAs, and a second quantum well layer 12c of AlAs is provided at both outer sides of the barrier layers 12b similarly to the layer 14c of FIG. 1. There, the TBQ structure is formed by repeatedly stacking the layers 12a–12c. In the illustrated example, the thickness of the layer 12a is set to 2.8 nm while the thickness of the layer 12b is set to 4.0 nm. Further, the thickness of the layer 12c is set to 7.0 nm.

In correspondence to the limited thickness of the layer 12a, there are formed discrete quantum levels such as $E_1$ for the electrons and $H_1$ for the holes in the layer 12a as shown in FIG. 3, and the layer 12a forms a quantum well similar to the quantum well layer 14a of FIG. 1. Thereby, the energy gap between the quantum level $E_1$ and $H_1$ is represented as Egap1. Further, in the quantum well layer 12a, the energy gap between the bottom edge of the conduction band Ec and the top edge of the valence band Ev is represented by a gap energy $Eg_1$ as shown in FIG. 3. As both the bottom edge of the conduction band and the top edge of the valence band correspond to the $\Gamma$ point, it will be understood that the energy gap $Eg_1$ has the value of 1.42 eV. See the band diagram of FIG. 2(A). There, the thickness of the layer 12a is adjusted in correspondence to the wavelength of the incident optical beam such that the incident optical beam causes an excitation of the electrons from the quantum level $H_1$ to the quantum level $E_1$. Thereby, the electrons thus excited and the holes that have been left in the valence band form excitons at an energy level slightly lower than the quantum level $E_1$, and such excitons impede further absorption of the optical beam, similarly to the conventional TBQ explained in FIG. 1. In other words, the quantum well layer 12a and hence the layered body 12 shows the non-linear response of optical absorption. Similarly to the device of FIG. 1, the electrons thus excited are dissipated from the layer 12a by causing a tunneling through the barrier layer 12b. In order to facilitate the quick removal of the free electrons, the thickness of the barrier layer 12b is set small enough that the electrons can escape from the layer 12a freely by tunneling through the barrier layer 12b.

In the present embodiment, it should be noted that the AlAs layer 12c has the conduction band Ec that includes the X valley at an energy level located substantially lower than the quantum level $E_1$ In FIG. 3, the energy gap between the lower edge of the conduction band and the top edge of the valence band is represented as $Eg_3$, wherein, in the case of AlAs, it should be noted that the bottom edge of the conduction band corresponds to the X point while the top edge of the valence band corresponds to the $\Gamma$ point. See FIG. 2(B). Thus, the energy gap $Eg_3$ has the value of 2.16 eV. Further, the thickness of the layer 12c is set large enough such that there is formed a quantum level $E_2$ in the layer 12c at an energy level substantially lower than the quantum level $E_1$ of the layer 12a. Thereby, the excited electrons in the quantum well layer 12a can always escape to the quantum level $E_2$ of the quantum well layer 12c and the quick removal of the free electrons from the layer 12a is guaranteed.

In the quantum well layer 12c, the optical excitation of the electrons from the top edge of the conduction band Ec to the quantum level $E_2$ does not occur easily, as such a transition involves the indirect transition mechanism as already explained. It should be noted that the quantum level $E_2$ is formed in correspondence to the X point of the conduction band while the top edge of the valence band is formed in correspondence to the Γ point. Further, the optical excitation by the direct transition mechanism does not occur as the Γ point of the conduction band is located at an energy level much higher than the quantum level $E_1$ as shown in FIG. 3. In fact, the conduction band of the quantum well layer 12c has the Γ valley at an energy level much higher than the conduction band of the barrier layer 12b. As long as the incident optical beam has the wavelength corresponding to the gap energy Egap1, the optical absorption by the quantum well layer 12c does not occur. In order to cause an optical absorption in the layer 12c, the incident optical beam has to have an energy larger than Egap2, that is, the band gap of the layer 12c at the Γ point.

The material for the layers 12a–12c that realizes the band structure of FIG. 3 is not limited to the above combination of GaAs, AlGaAs and AlAs. Generally, a material having the composition $Al_xGa_{1-x}As$ with the compositional parameter x in the range of $0 < X < 0.45$ is suitable for the layer 12a, while a material having the composition $Al_yGa_{1-y}As$ with the compositional parameter y set in the range of $x < y$ is suitable for the layer 12b. Further, a material having a composition $Al_zGa_{1-z}As$ with the compositional parameter z set in the range of $y < z < 1$ is suitable for the layer 12c.

It should be noted that the Laid-open European patent application EP 0 358 229 or U.S. Ser. No. 758,857 mentioned previously describes, in its third embodiment, the use of AlAs for the barrier layer of TBQ in combination with the first quantum well layer of GaAs and the second quantum well layer of AlGaAs. There, the TBQ device described in this prior art reference eliminates the optical beam by the second quantum well layer by increasing the gap energy between the quantum level of the electrons and the quantum level of the holes in the second quantum well layer while simultaneously setting the quantum level of the electrons in the second quantum well layer lower than the quantum level of electrons in the first quantum well layer for the effective removal of the electrons from the first quantum well layer. This reference, however, is silent about the use of the large gap energy between the conduction band and the valence band in correspondence to the Γ point for eliminating the optical absorption of the second quantum well layer as taught in the present invention. Further, the reference is silent about the formation of the quantum level of electrons in the second quantum well layer in correspondence to the X valley of the conduction band for facilitating the removal of the electrons from the first quantum well layer.

Figure 4:
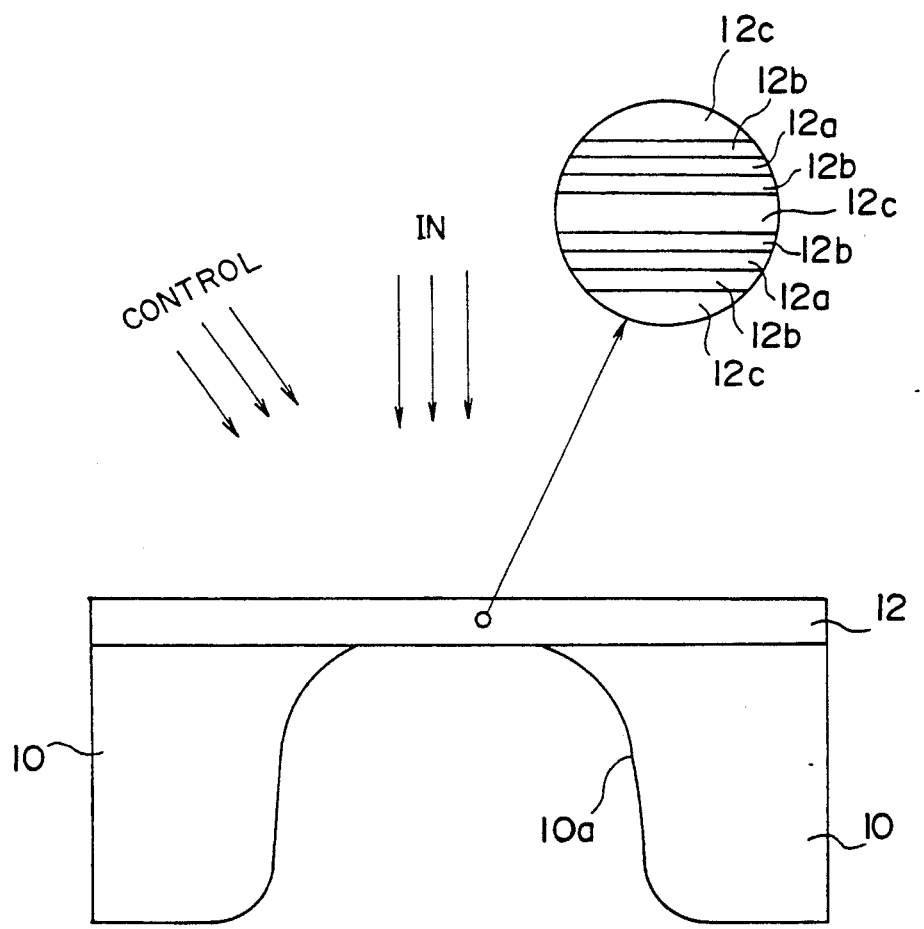
FIG. 4 is a diagram showing the structure of the non-linear semiconductor optical device of the first embodiment.

FIG. 4 shows the structure of the non-linear semiconductor optical device according to the first embodiment.

Referring to FIG. 4, there is provided a substrate 10 of GaAs on which the layered body 12 is provided. As already described and as illustrated in the enlarged view of FIG. 4, the layered body 12 is formed by repeatedly stacking the layers 12a–12c, wherein the unit of repetition includes the layers 12b, 12a, 12b and 12c. Further, the substrate 10 is provided with a window 10a for exposing the lower major surface of the layered body 12.

In operation, a signal optical beam is supplied as indicated by arrows IN, while the optical property of the layered body 12 is controlled by irradiating a control optical beam as indicated by arrows designated as CONTROL. There, when the control optical beam is irradiated with a sufficient intensity, the layered body 12 is saturated. When this occurs, the layered body 12 does not absorb the optical beam anymore. In other words, the signal optical beam passes through the layered body 12 freely. On the other hand, when the control optical beam is interrupted, the layered body 12 quickly recovers the original optical state, and the absorption of the signal optical beam is resumed thereby. In the device of the present embodiment, the absorption of the signal optical beam by the second quantum well layer 12c does not occur due to the improved band structure of the layer 12c as described previously.

Figure 5A:
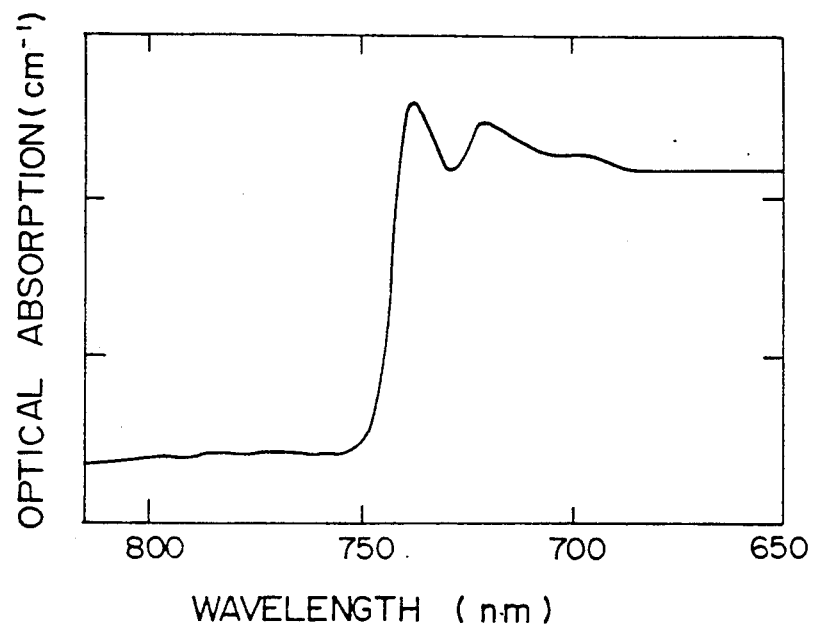
FIGS. 5(A) and 5(B) are digrams respectively showing the optical absorption achieved by the device of the first embodiment of the present invention and by the conventional TBQ device of which band diagram is shown in FIG. 1.

FIG. 5(A) shows the optical absorption spectrum of the non-linear semiconductor optical device of the present embodiment. As can be seen in the drawing, there is a distinct step at the wavelength of about 740 nm at which the optical absorption coefficient drops sharply. Here, the predominant absorption peak associated with the step is attributed to the excitation of electrons and heavy holes, while the secondary absorption peak at the shorter wavelength side is attributed to the excitation of electrons and light holes.

Figure 5B:
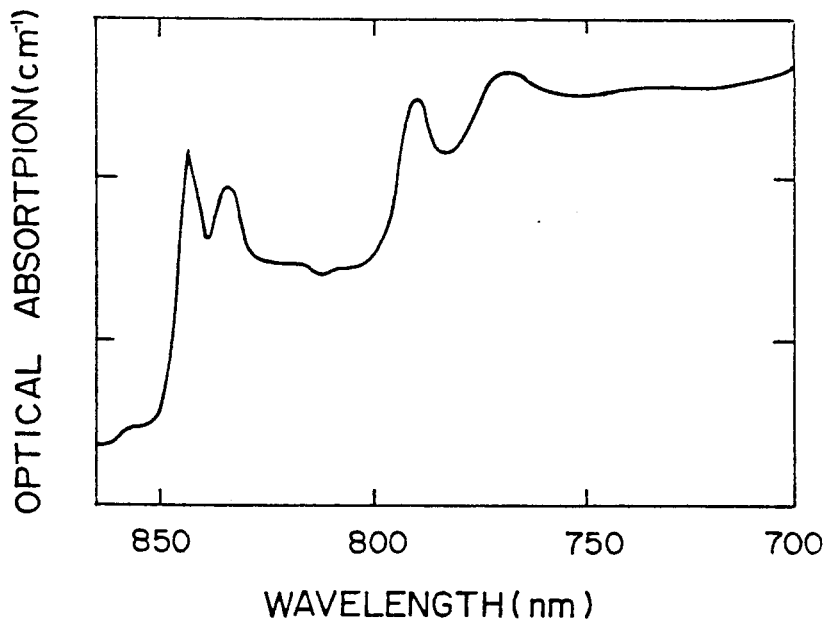

One can see the effect of the present invention clearly by comparing the diagram of FIG. 5(A) with FIG. 5(B) that shows the absorption spectrum of the conventional device of FIG. 1. In the conventional case, one can observe clearly a two-step pattern including a first step at the wavelength of about 845 nm and a second step at about 790 nm. Here, the second step is attributed to absorption caused by the quantum well layer 14a that corresponds to the quantum well layer 12a, while the first step is attributed to the absorption caused by the quantum well layer 14c that corresponds to the quantum well layer 12c. FIG. 5(B) clearly indicates that there is a substantial optical absorption by the quantum well layer 14c and the effect of the optical absorption caused by the layer 14c is overlapped on the optical absorption effect caused by the layer 14a. Thereby, the signal-to-noise ratio of the conventional non-linear semiconductor optical device is inevitable deteriorated. In the construction of the present invention, one can completely eliminate the problem of unwanted optical absorption by the layer 12c as can be seen clearly in FIG. 5(A). Thereby, the non-linear semiconductor optical device of the present invention can provide a significantly improved signal-to-noise ratio. Further, it should be noted that the optical state of the device of FIG. 4 can be controlled by the signal optical beam alone, provided that the signal optical beam has a sufficient intensity. Generally, the device of FIG. 4 changes its optical state whenever an incident optical beam having a wavelength corresponding to the energy $E_{gap1}$ is supplied with sufficient intensity.

Figure 6:
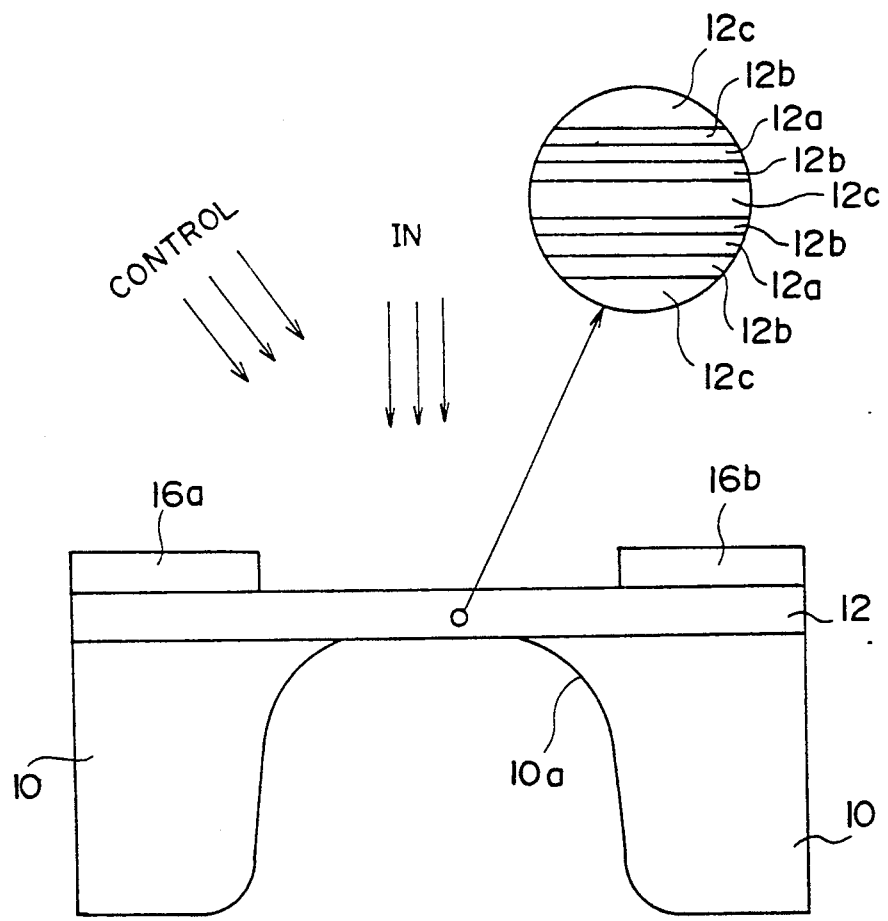
FIG. 6 is a diagram showing a non-linear semiconductor optical device according to a second embodiment of the present invention.

Next, a second embodiment of the present invention will be described with reference to FIG. 6. In FIG. 6, those parts that have been described previously with reference to the preceding drawings are designated by the same reference numerals, and the description thereof will be omitted.

In the embodiment of FIG. 6, a Schottky electrode 16a and another Schottky electrode 16b are provided on the upper major surface of the layered body 12 such that the electrodes 16a and 16b oppose with each other across the part of the layered body 12 that is illuminated the incident optical beam in correspondence to the window 10a. In the typical example, the electrodes 16a and 16b are formed of Al and separated from each other by a distance of 10 μm.

Figure 7:
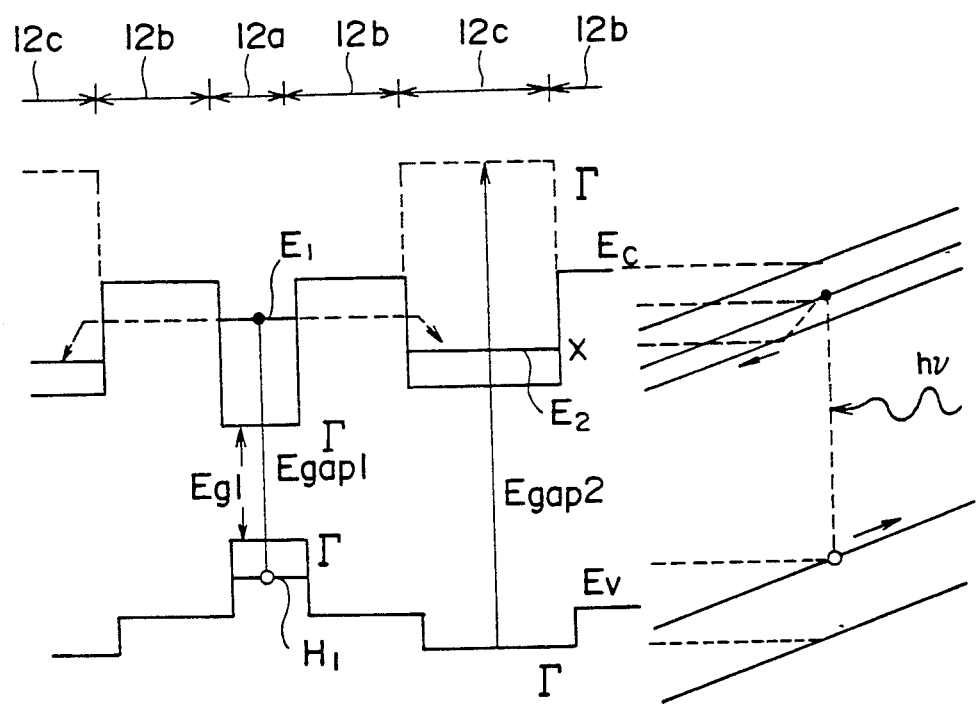
FIG. 7 is a band diagram showing the principle of operation of the second embodiment of the present invention.

In operation, a bias voltage is applied across the electrodes 16a and 16b. In response to the bias voltage, an electric field is induced in the layered body 12, and such an electric field in turn induces a gradient in the energy band of the layers 12a–12c as illustrated in the right section of FIG. 7. In FIG. 7, it should be noted that the right section represents the profile of the quantum levels $E_1$, $H_1$ and $E_2$ as well as the bottom edge of the conduction band Ec and the top edge of the valence band Ev taken along the direction perpendicular to the sheet of the drawing. Thereby, it will be understood that the electrons at the quantum level $E_2$ of the layer 12c are accelerated along the layer 12c toward the electrode 16a to which a positive bias voltage is applied, while the holes at the quantum level $H_1$ of the layer 12a are accelerated along the layer 12a toward the electrode 16b to which a negative bias voltage is applied. By applying the bias voltage as such, one can effectively remove the carriers that have been excited by the optical absorption, and the time needed for the non-linear semiconductor optical device to resume the original optical state is substantially reduced. In the device of FIG. 4, there is a tendency that the holes remain in the layer 12a after the electrons have escaped to the quantum well layer 12c because of the large effective mass of the holes that impedes the dissipation to the quantum well layer 12c. Even in such a case, one can successfully and efficiently remove the holes from the quantum well layer 12a, without causing a tunneling to the quantum well layer 12c.

Figure 8:
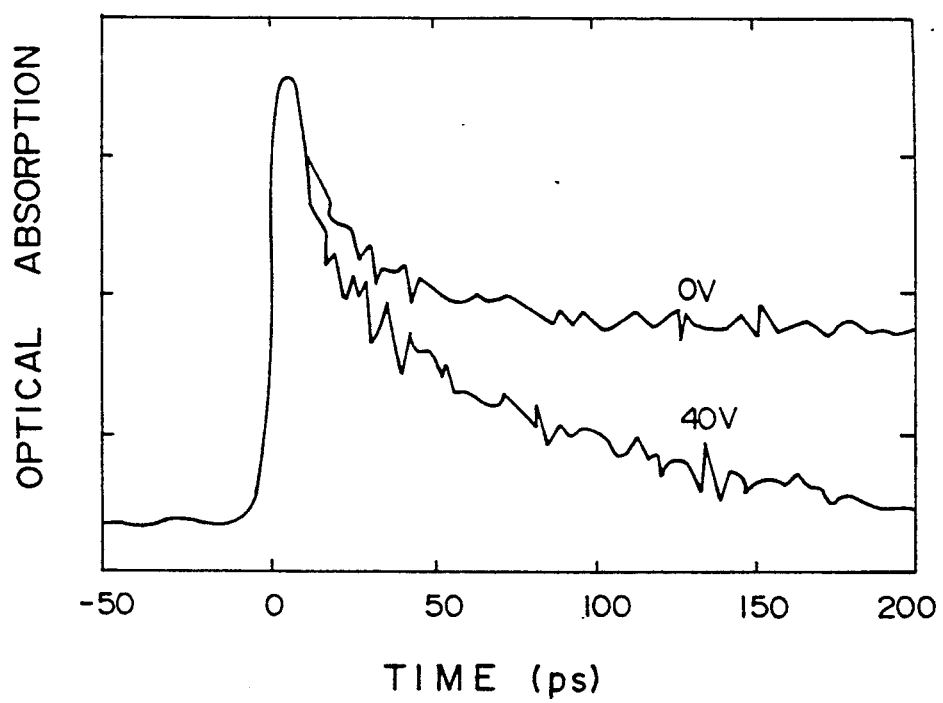
FIG. 8 is a diagram showing the response achieved by the device of the second embodiment.

FIG. 8 shows the effect achieved by the present embodiment.

Referring to FIG. 8 showing the recovery of the optical absorption after an incident optical impulse at t=0, it will be noted that the original optical absorption does not return within the time scale of the drawing as long as there is no bias voltage applied across the electrodes 16a and 16b. When a bias voltage of 40 volts is applied, on the other hand, the original optical absorption returns in the matter of 200 picoseconds.

Figure 9:
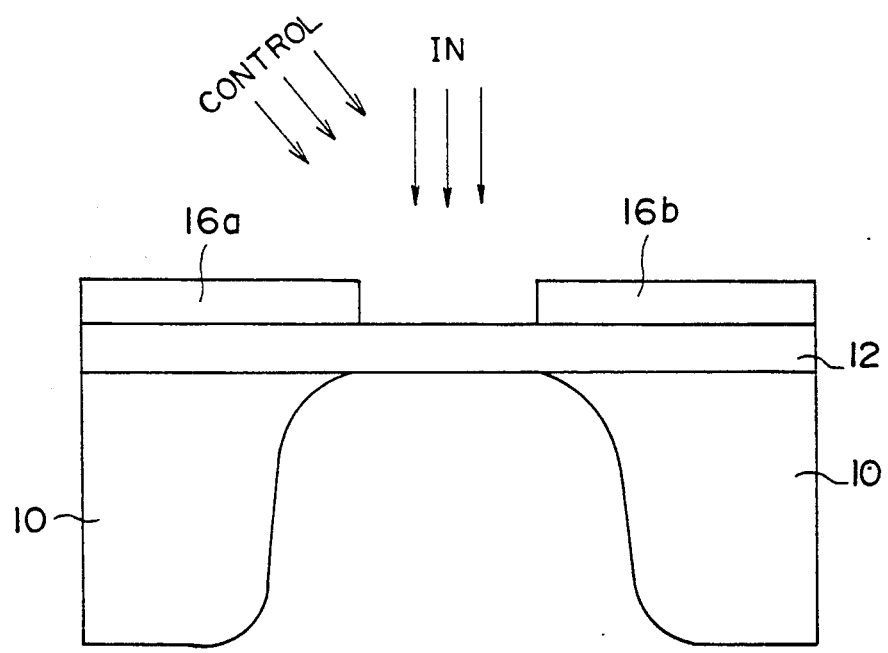
FIG. 9 is diagram showing the structure of a non-linear semiconductor optical device according to a third embodiment of the present invention.

FIG. 9 shows a third embodiment of the present invention. In the present embodiment, the separation between the electrodes 16a and 16b is set substantially smaller than 10 μm. Thereby, the area of the layered body 12 that is illuminated by the incident optical beam such as the signal optical beam and the control optical beam is reduced. Thereby, the recovery of the original optical state is further accelerated.

Figure 10:
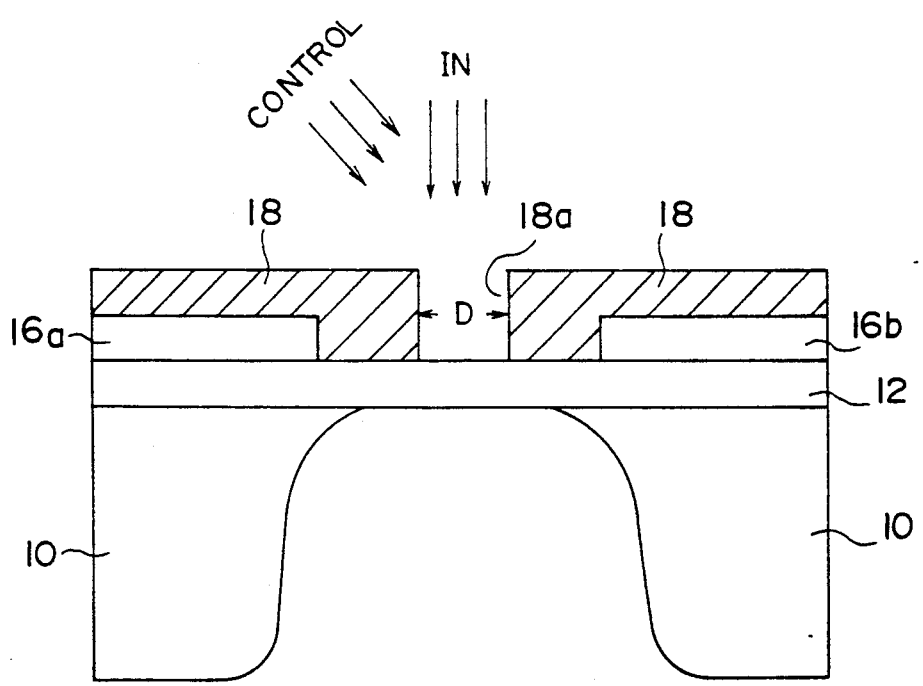
FIG. 10 is a diagram showing the structure of a non-linear semiconductor optical device according to a fourth embodiment of the present invention.

FIG. 10 shows a fourth embodiment of the present invention. In the present embodiment, the area that is illuminated by the signal optical beam and the control optical beam is reduced by providing an optical mask 18 that has an elongating slit 18a. In the illustrated example, the slit 18a has a width D of 1 μm. On the other hand, the distance between the electrodes 16a and 16b is held at 10 μm similarly to the embodiment of FIG. 6. In the present embodiment, the distance between the electrodes 16a and 16b is held at a relatively large value. Thereby, one can guarantee a uniform electric field across the electrodes 16a and 16b while simultaneously reducing the area of illumination by the mask 18.

Figure 11:
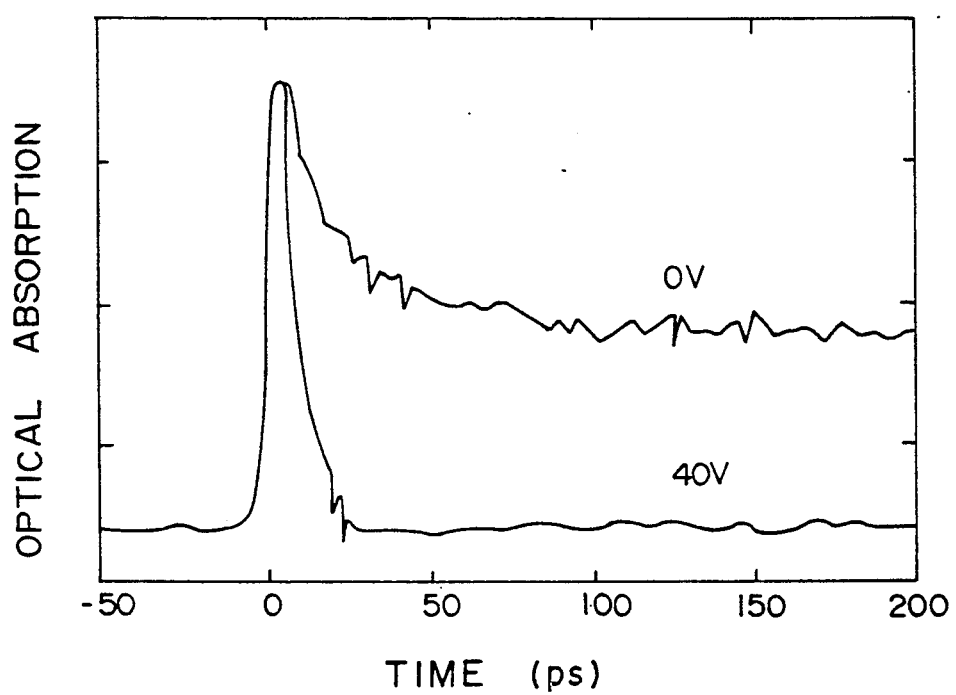
FIG. 11 is a diagram showing the response achieved by the device of the fourth embodiment.

FIG. 11 shows the response of the optical absorption achieved by the device of FIG. 10 for the case in which no bias voltage is applied and for the case in which a bias voltage of 40 volts is applied across the electrodes 16a and 16b. As can be seen, the recovery of the original optical state is achieved in the matter of 20 picoseconds when a bias voltage of 40 volts is applied across the electrodes 16a and 16b.

Figure 12:
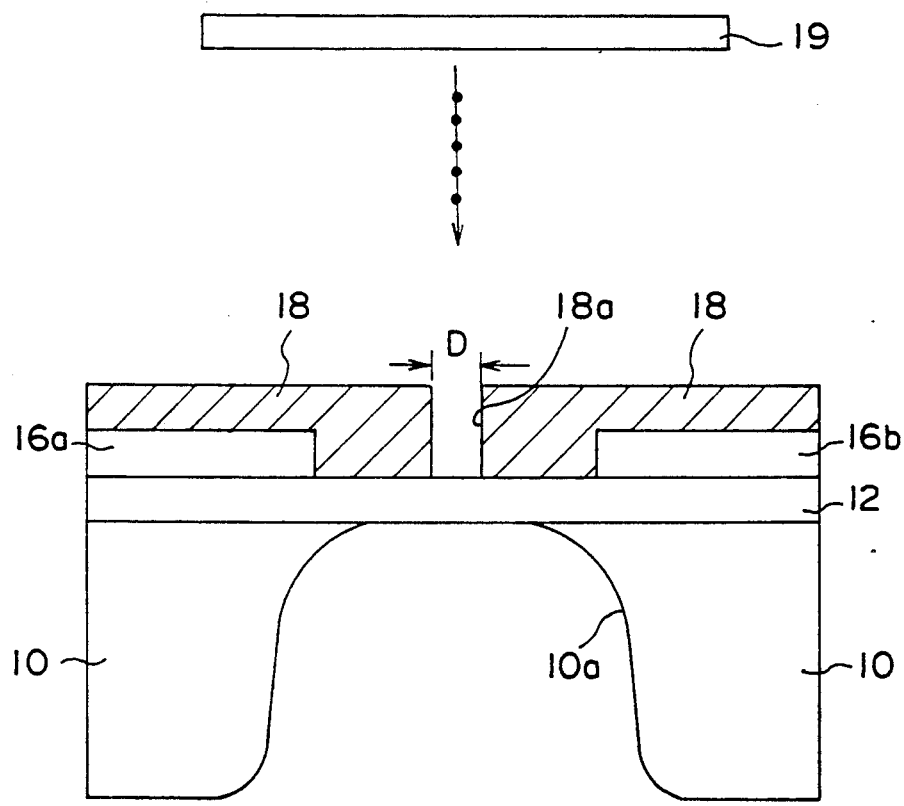
FIG. 12 is a diagram showing a non-linear semiconductor optical device according to a fifth embodiment of the present invention.

FIG. 12 shows a fifth embodiment of the present invention. The present embodiment has a construction similar to the device of FIG. 10 except that the mask 18 is formed such that the area of illumination is reduced further. More specifically, the mask 18 is formed to define the slit 18a similarly to the previous embodiment of FIG. 10, wherein the width D of the slit 18a is set smaller than the wavelength of the incident optical beam. In the illustrated example, the width D is set to 0.1 μm that is substantially smaller than the wavelength 0.8 μm of the incident optical beam. In order to pass the optical beam through such a narrow slit, the device of FIG. 12 uses a polarizer 19 that produces an optical beam of which polarization plane extends parallel to the elongating direction of the slit 18a.

Figure 13:
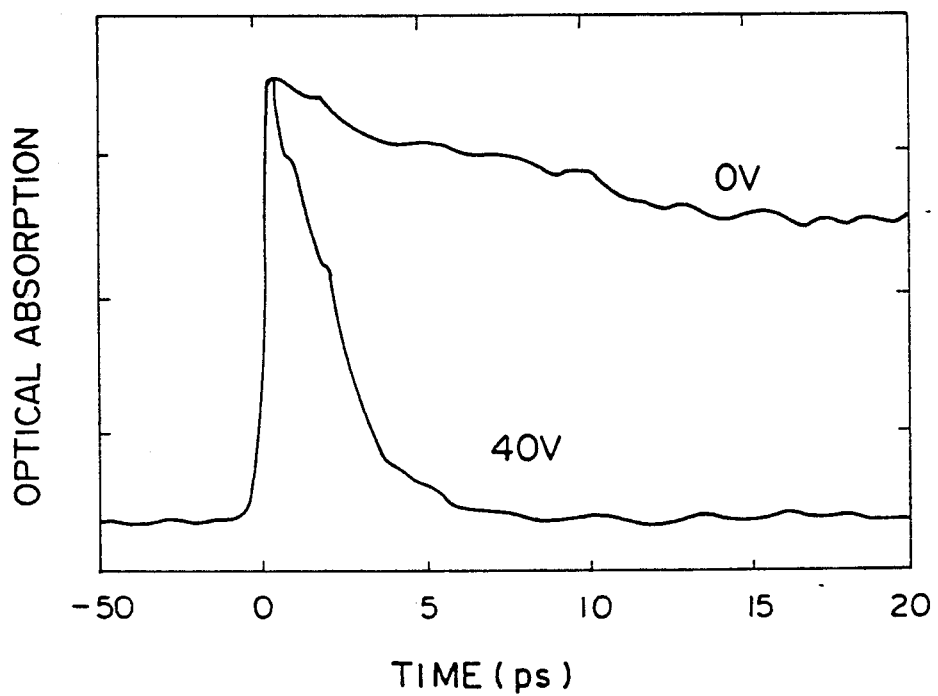
FIG. 13 is a diagram showing the response achieved by the device of the fifth embodiment.

FIG. 13 shows the response of the optical absorption achieved by the device of the fifth embodiment for the case in which no bias voltage is applied across the electrodes 16a and 16b and for the case in which a bias voltage of 40 volts is applied across the electrodes 16a and 16b. As can be seen clearly, the original optical state is recovered in the matter of five picoseconds by applying the bias voltage of 40 volts.

Next, a sixth embodiment of the present invention will be described with reference to the band diagram of FIG. 14.

Figure 14:
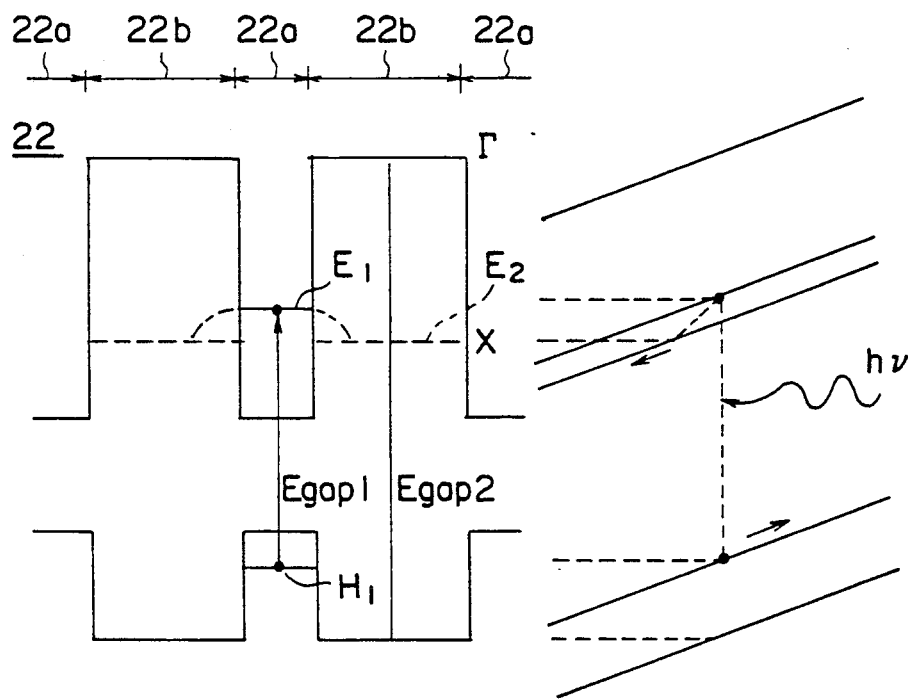
FIG. 14 is a diagram showing the structure of a non-linear semiconductor optical device according to a sixth embodiment of the present invention.

Referring to FIG. 14, the non-linear semiconductor optical device of the present embodiment employs a layered body 22 that is formed by an alternate stacking of a quantum well layer 22a and a barrier layer 22b. In other words, the layered body 22 has a MQW structure wherein the quantum well layer 22a is sandwiched by a pair of barrier layers 22b. Typically, the quantum well layer 22a is formed of undoped GaAs and has a thickness of 2.8 nm. On the other hand, the barrier layer 22b is formed of undoped AlAs and has a thickness of 7.0 nm. Thereby, a pair of barrier layers 22b define a potential well in correspondence to the layer 22a, and discrete quantum levels $E_1$ for the electrons and $H_1$ for the holes are formed with an energy gap Egap1 corresponding to the wavelength of the incident optical beam.

By using AlAs for the barrier layers 22b, the X point of the conduction band is located at an energy level lower than the quantum level $E_1$. Thereby, the electrons can escape freely from the layer 22a to the layer 22b after the optical excitation. On the other hand, the layer 22b has the conduction band in correspondence to the Γ point at the energy level much higher than the lower edge of the conduction band of the layer 22a. Thus, the layer 22b acts as the effective barrier layer. The device having the band structure shown in FIG. 14 shows a response that is faster than the TBQ device, because of the absence of the barrier layer.

In the device of the present embodiment, too, electrodes are provided for inducing an electric field in the layered body as shown in the right part of FIG. 14. The electric field thus induced causes a gradient in the band structure, and the electrons and holes are removed by moving along the sloped conduction band or by moving along the sloped quantum level of the layers 22a and 22b.

Figure 15:
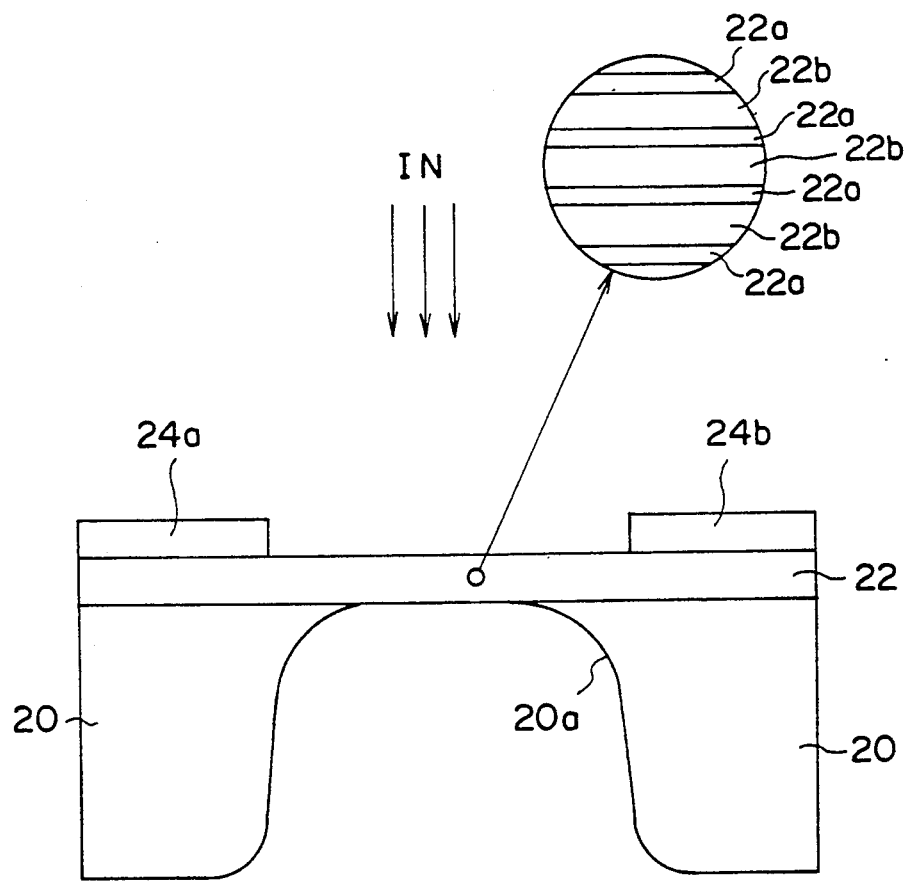
FIG. 15 is a band diagram showing the principal of operation of the device of the sixth embodiment.

FIG. 15 shows the structure of the non-linear semiconductor optical device of the foregoing embodiment.

Referring to FIG. 15, the device includes a GaAs substrate 20 that is provided with a cutout or window 20a, and the layered body 22 is provided on the substrate 20. Further, electrodes 24a and 24b are provided on the upper major surface of the layered body 22 to oppose with each other across a region of the layer 22 that passes the incident optical beam. The electric field explained with reference to FIG. 14 is induced by applying a bias voltage across the electrodes 24a and 24b. Thereby, the quick removal of the carriers from the layered body 22 is guaranteed.

The electrodes 24a and 24b may be formed as the Schottky electrode. In this case, Al is deposited on the upper major surface of the layered body 22 and patterned subsequently to form the electrodes 24a and 24b. Alternatively, the layered body 22 may be provided with an n+-type contact region and a p+-type contact region respectively in correspondence to the electrode 24a and the electrode 24b. In this case, the electrode 24a is formed to have a structure of AuGe/Au and establishes an ohmic contact with the n+-type contact region underneath. Similarly, the electrode 24b is formed to have a structure of Au/Zn/Au and establishes an ohmic contact with the p+-type contact region underneath. As is well known, the n+-type contact region may be formed by the ion implantation of Si and subsequent annealing, while the p+-type contact region can be formed by the ion implantation of Zn and subsequent annealing.

As already noted, the device of the present embodiment is advantageous in maximizing the speed of recovery to the original optical state by eliminating the tunneling barrier layer. On the other hand, the device of the present embodiment cannot control the rate of dissipation of the excited carriers to the second quantum well layer 22b because of the absence of the intervening tunneling barrier layer in contrast to the TBQ device.

Figure 16:
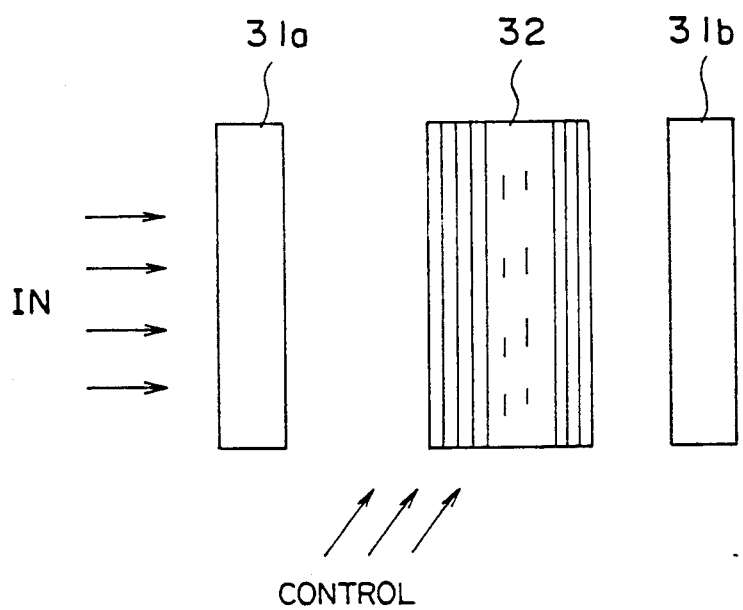
FIG. 16 is a diagram showing the structure of a variable optical resonator according to a seventh embodiment of the present invention.

FIG. 16 shows a non-linear optical resonator or etalon according to a seventh embodiment of the present invention.

Referring to FIG. 16, the device of the present embodiment includes a pair of semitransparent reflectors 31a and 31b and a layered body 32 that has the TBQ structure explained with reference to the previous embodiments. More specifically, the layered body 32 has a structure identical with the layered body 12. There, the distance between the mirrors 31a and 31b is set approximately equal to a multiple integer of the half-wavelength of the incident optical beam that is supplied perpendicularly to the principal plane of the reflectors 31a and 31b. It should be noted that the layered body 32 is disposed such that the major surface of the semiconductor layers therein extend parallel to the principal surface of the reflectors 31a and 31b. Further, a control optical beam is irradiated on the layered body 32 in the direction oblique to the direction of the incident optical beam as illustrated in FIG. 16.

Figure 17:
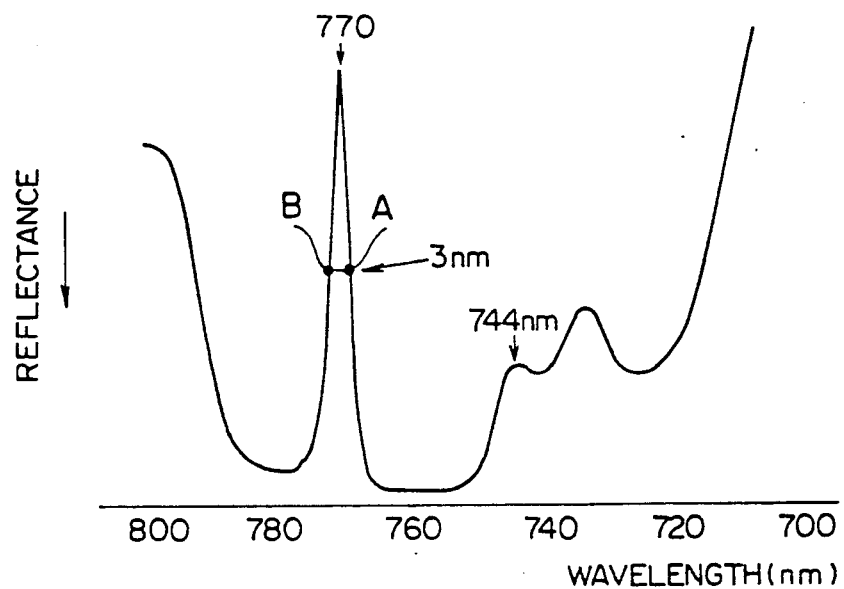
FIG. 17 is a diagram showing the spectrum of reflectance of the variable optical resonator of FIG. 16.

FIG. 17 shows the reflection spectrum of the device of FIG. 16 in the state where there is no irradiation of the control optical beam. As can be seen in FIG. 17, there is a sharp resonant peak of etalon at the wavelength of 770 nm. In correspondence to the peak of the resonance, the reflectance of the etalon becomes minimum. Further, other more diffused peaks attributed to the excitons are observed at shorter wavelengths such as 744 nm.

Figure 18:
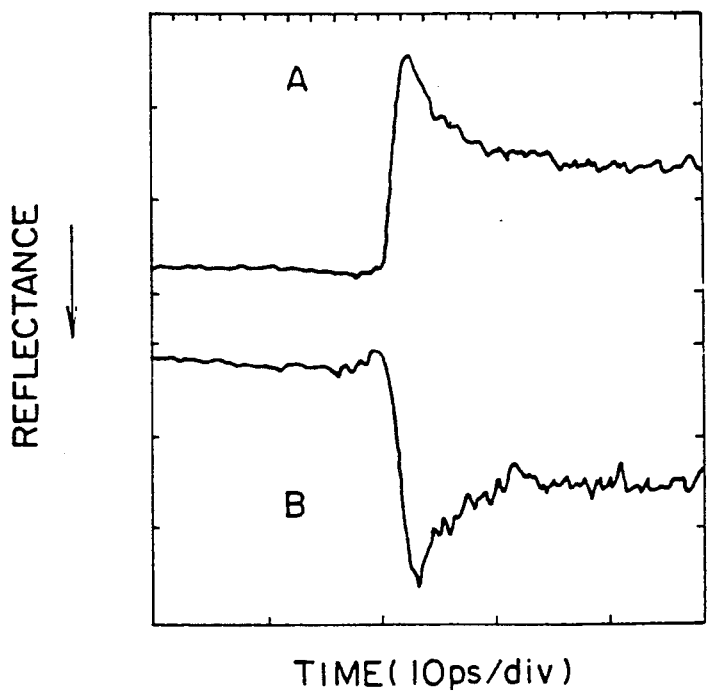
FIG. 18 is a diagram showing the response of reflectance of the variable optical resonator of FIG. 16.

Upon irradiation of the control optical beam, the resonant peak of the etalon shifts in the shorter wavelength direction. Thereby, the peak of the resonance shifts to a point A of which wavelength is 767 nm, and the reflectance for the optical beam at the point A drops sharply as illustrated in FIG. 18 by a curve A. On the other hand, the reflectance at a point B corresponding to the wavelength of 773 nm increases sharply upon irradiation of the optical beam as represented also in FIG. 18 by a curve B.

By constructing the layered body 32 similarly to the layered body 12 or 22 explained already with reference to the first embodiment and sixth embodiment, one can eliminate the unwanted optical absorption by the second quantum well layer 12a, and the etalon of the present invention shows a large change of reflectance. After the interruption of the control optical beam, the reflectance returns as indicated in FIG. 18. Of course, the recovery of the original optical state is facilitated by providing the electrodes as explained with reference to the second embodiment of the present invention.

Figure 19:
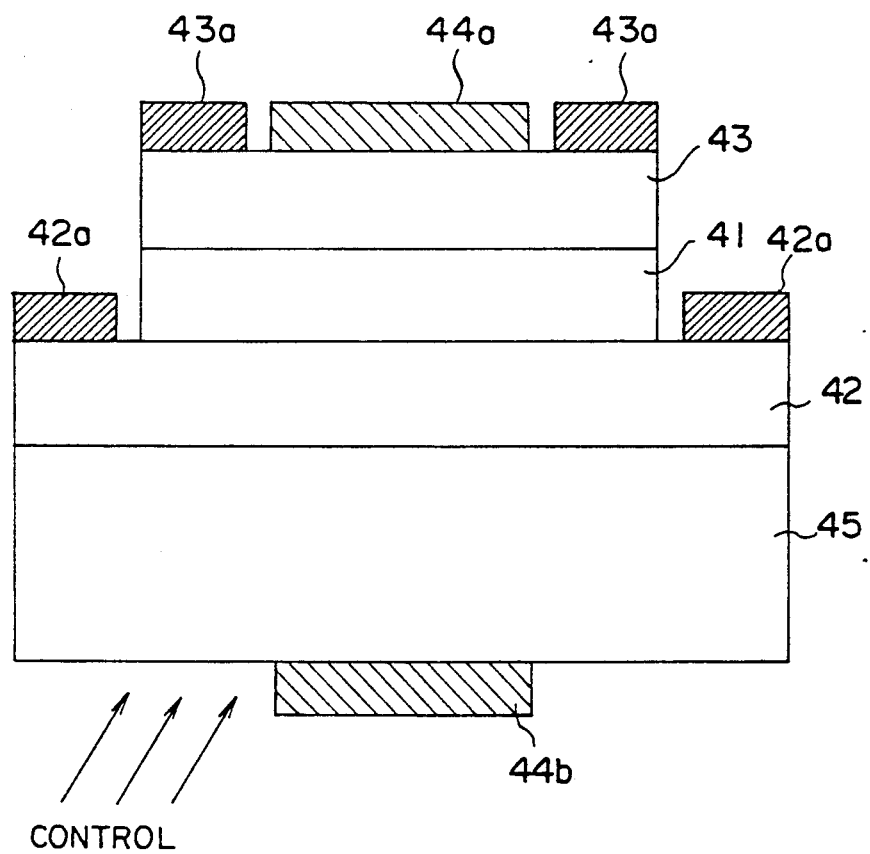
FIG. 19 is a diagram showing the structure of an optically bistable laser diode according to an eighth embodiment of the present invention.

FIG. 19 shows an optical bistable laser diode according to an eighth embodiment of the present invention, wherein the layered body 12 or 22 is used for the saturable absorption layer that characterizes the structure of the optical bistable laser diode.

Referring to FIG. 19, the device of the present embodiment includes an active layer 41 of p-type AlGaAs that is provided on the upper major surface of an n-type AlGaAs contact layer 42. As usual, the active layer 41 is injected with electrons and holes and produces an optical beam as a result of the stimulated emission. On the active layer 41, there is provided another contact layer 43 of p-type AlGaAs, and a first reflector 44a is provided on the upper major surface of the contact layer 43. Further, an electrode 43a is provided on the upper major surface of the contact layer 43 to surround the reflector 44a laterally. Similarly, a second electrode 43b is provided on the upper major surface of the contact layer 42 to surround the active layer 41 laterally. There, the electrons and holes are injected to the active layer from the electrodes 43a and 43b via the contact layers 42 and 43. Further, the device of the present embodiment has a saturable absorption layer 45 under the contact layer 42 as illustrated, and a second reflector 44b is provided at the lower major surface of the saturable absorption layer 45 such that the reflectors 44a and 44b oppose with each other with a predetermined distance. The saturable absorption layer 45 has a construction identical with the layered body 12 or 22 and changes the optical absorption in response to a control optical beam that is supplied obliquely to the lower major surface of the layer 45. There, the saturable absorption layer 45 is tuned to the optical radiation that is produced by the active layer 41. More specifically, the energy gap $E_{gap1}$ of the layer 12a is tuned to the wavelength of the optical beam that is produced in the active layer 41.

In operation, the laser diode is driven with a bias current of which level is set such that the laser oscillation occurs when there is no absorption in the saturable absorption layer 45. Because of the absorption of the optical beam by the layer 45, the laser diode cannot start oscillation even when biased as such. Next, a strong control optical beam is irradiated on the saturable absorption layer 45. In response thereto, the saturable absorption layer 45 loses the capability of optical absorption and becomes transparent. Thereby, the laser oscillation is started. Once the laser oscillation has started, the layer 45 is urged to the transparent state by the optical radiation that is produced as a result of the laser oscillation. When the optical beam is interrupted, the laser oscillation stops immediately.

Next, a non-linear semiconductor optical device according to a ninth embodiment of the present invention will be described with reference to FIG. 20 that shows the band structure of a layered body 50. This layered body has the TBQ structure similar to the layered body 12 of the first embodiment. On the other hand, the present embodiment is designed to eliminate the dwelling of the holes in the central quantum well layer of TBQ without applying electric fields.

Figure 20:
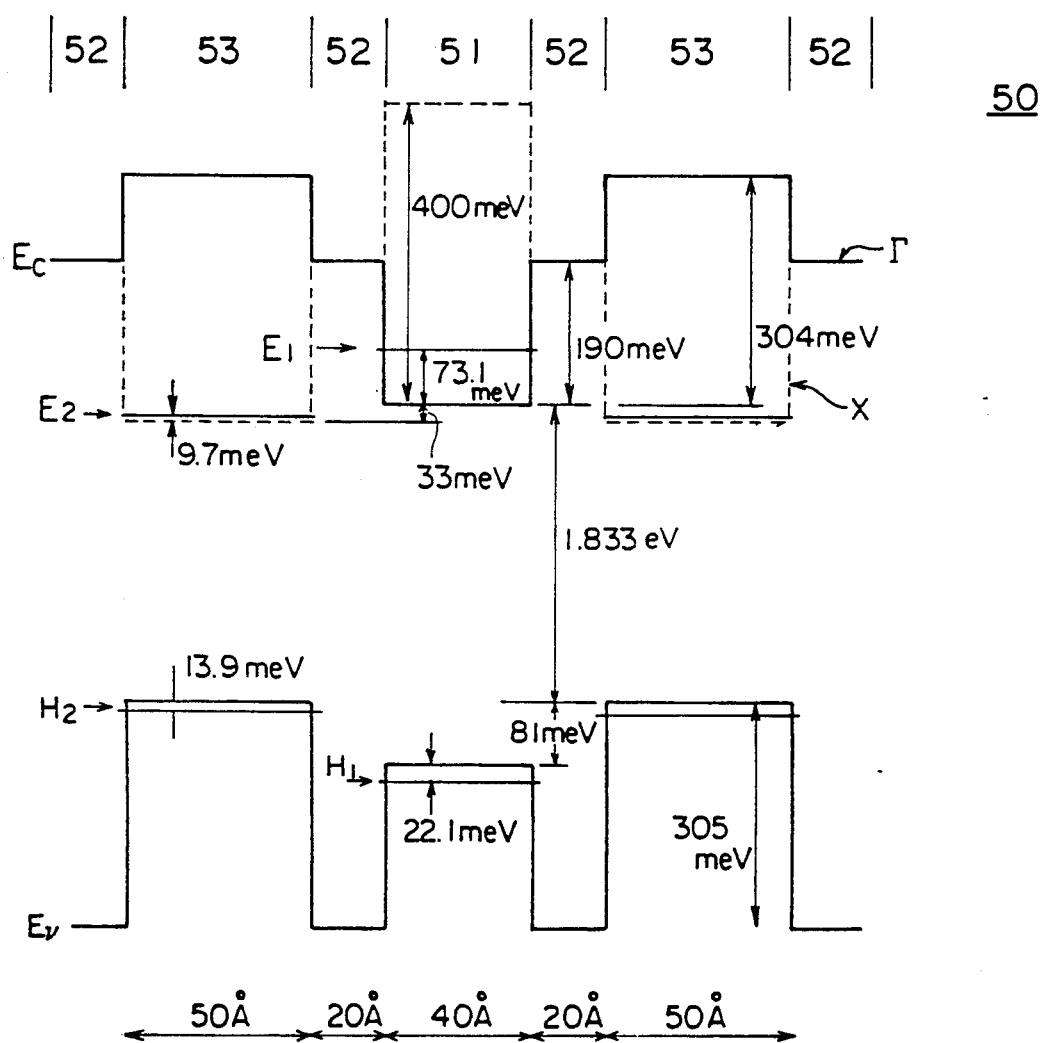
FIG. 20 is showing the band structure of a non-linear optical device according to a ninth embodiment of the present invention.

Referring to FIG. 20 the layered body 50 includes a first quantum well layer 51 of undoped InGaP having a composition of $In_xGa_{1-x}P$ with the compositional parameter x of 0.48 and a thickness of 40 Å. The layer 51 is sandwiched by a pair of barrier layers 52 of InGaAlP each having a composition of $In_{0.5}(Ga_{1-x}Al_x)0.5P$ with the compositional parameter x of 0.7 and a thickness of 20 Å. Further, a second quantum well layer 53 of GaSbP having a composition of $GaSb_{1-x}P_x$ with the compositional parameter x of 0.69 is provided at both outer sides of the barrier layer 52 with a thickness of 50 Å. There, the layers 51–53 are stacked repeatedly for about 100 times. There, the unit of repetition can be represented as 53/52/51/52.

In the band diagram of FIG. 20, it will be noted that the conduction band Ec is represented by the continuous line as well as by a broken line, wherein the continuous line represents the $\Gamma$ valley while the broken line represents the X valley. On the other hand, the edge of the valence band Ev is represented by the continuous line and corresponds to the $\Gamma$ valley. There, the layer 51 has the band structure of the direct transition type and the barrier layer 52 forms a potential well of the depth of 190 meV in correspondence to the layer 51. Thereby, a quantum level $E_1$ of electrons is formed in the quantum well layer 51 at a level of 73.1 meV when measured from the bottom edge of the conduction band. In correspondence to the quantum level $E_1$, a quantum level $H_1$ of holes is formed in the layer 51 at a level of 22.1 meV when measured from the top edge of the valence band. The quantum well layer 51 thus formed interacts with the incident optical beam having the wavelength corresponding to the energy of about 2 eV.

On the other hand, the layer 53 has the band structure of the indirect transition type and has a quantum level $E_2$ of electrons at a level of only 9.7 meV above the bottom edge of the X valley. There, the quantum level $E_2$ is located at an energy level substantially lower than the quantum level $E_1$, and the electrons that are excited in the quantum well layer 51 upon optical absorption can always escape to the quantum well layer 53 by tunneling through the barrier layer 52. Similarly to the first embodiment of the present invention, the optical absorption by the quantum well layer 53 does not occur, as the $\Gamma$ valley of the conduction band is located at an energy level much higher than top edge of the valence band of the barrier layer 51, even when the relative rise of the valence band is considered. In fact, the $\Gamma$ valley of the conduction band is located at an energy level higher than the quantum level $E_2$ by 304 meV.

The most significant feature of the present embodiment is that the quantum well layer 53 forms a quantum level $H_2$ of holes at an energy level lower than the quantum level $H_1$ of the layer 51. Thereby, the holes that are created in the layer 51 in response to the optical excitation of the electrons cause a tunneling through the barrier layer 52 to the quantum level $H_2$ of the layer 53. In other words, the holes are removed quickly from the layer 51, and the problem of dwelling of the holes in the quantum well layer 51 is effectively eliminated. Thereby, a quick recovery of the original optical state is guaranteed without using the electric biasing. It should be noted that the band diagram of FIG. 20 that enables the removal of the holes is characterized by the staggered type heterojunction with respect to the $\Gamma$ band of the quantum well layer 51 and the $\Gamma$ band of the quantum well layer 53.

Figure 21:
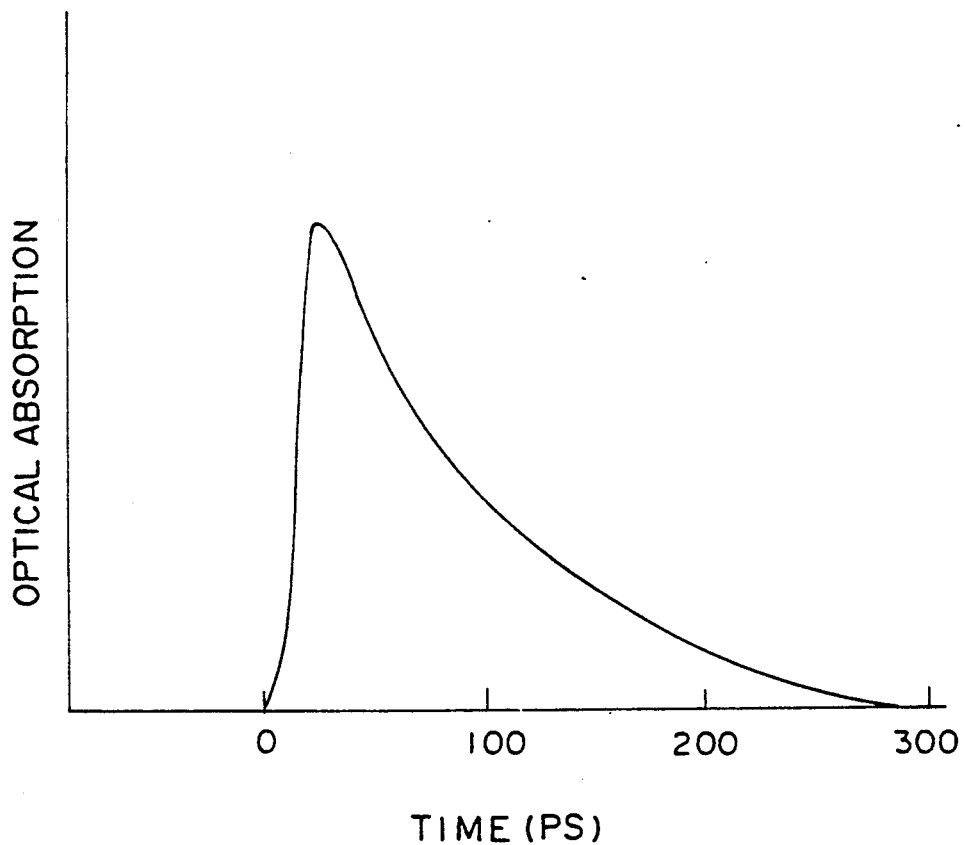
FIG. 21 is a diagram showing the response of the non-linear semiconductor optical device of FIG. 20.

FIG. 21 shows the response achieved by the non-linear semiconductor optical device in which the layered body 50 is used. The device itself has a structure similar to FIG. 4 and has a GaAs substrate corresponding to the substrate 10. Similarly to the device of FIG. 4, the GaAs substrate is provided with an opening or window similar to the window 10a for passing the optical beam. Such a window can be formed for example by an wet etching process that uses an ammoniac etchant. Typically, an AlAs layer (not shown in FIG. 4) is grown on the (100) surface of the GaAs substrate with a thickness of about 200 Å as the etching stopper, and the layered body 50 is grown thereon by the MBE process or MOCVD process. Further, the top surface of the layered body 50 as well as the exposed bottom surface of the AlAs etching stopper may be protected by a $SiO_2$ protection film.

As can be seen clearly in FIG. 21, the device of the present embodiment can recover the original optical state in the matter of 200 picoseconds. Comparison should be made with the characteristic diagram shown in FIGS. 8, 11 and 13, particularly for those curves corresponding to the case where no bias voltage is applied. The device of the present embodiment achieves the quick recovery without using the bias voltage.

Figure 22:
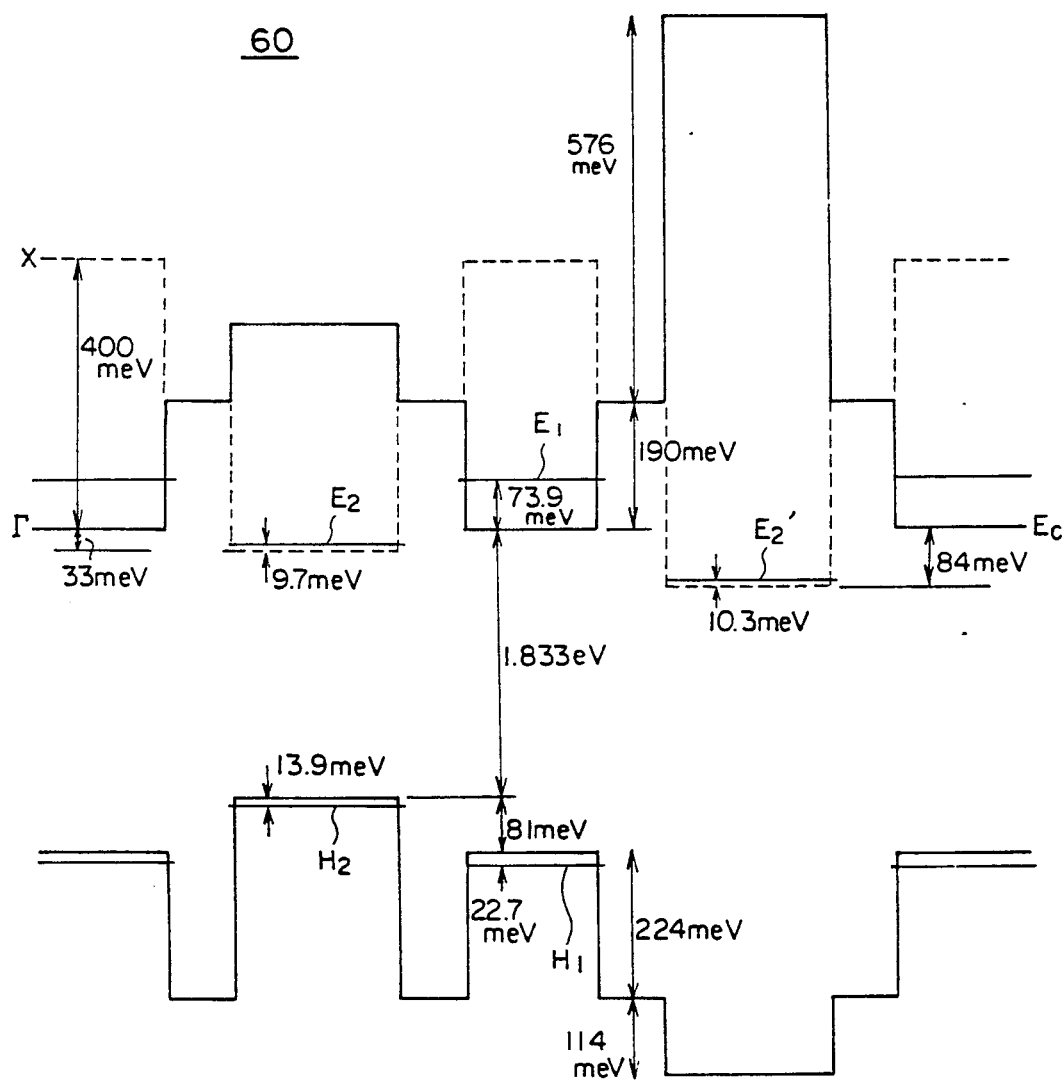
FIG. 22 is a diagram showing the band structure of a non-linear optical device according to a tenth embodiment of the present invention.

FIG. 22 shows the band structure of a layered body 60 used for the non-linear semiconductor optical device according to a tenth embodiment of the present invention, wherein two different materials are used for the second quantum well layer.

More specifically, the layered body 60 includes a first quantum well layer 61 having the composition and thickness identical with the layer 51 of the previous embodiment, and the layer 62 is sandwiched by a pair of barrier layers 62 also having the composition and thickness identical with the barrier layer 52 of the previous embodiment. In addition, a second quantum well layer 63 having the composition and thickness identical with the layer 53 is provided adjacent to one of the barrier layers 62. On the other hand, an AlAs layer 63' is provided adjacent to the other barrier layer 62.

In the layered body 60 having the band structure as shown in FIG. 22, it should be noted that the quantum level of holes is not formed in the AlAs layer 63'. Thereby, the holes that are created in the quantum well layer 61 cannot escape to the quantum well layer 63'. On the other hand, the other layer 63 has the quantum level $H_2$ of holes and the holes created in the quantum well layer 61 can escape to the quantum well layer 63 without problem. Of course, the electrons can escape to both the quantum well layer 63 and to the quantum well layer 63'.

Further, the present invention is not limited to the embodiments described heretofore, but various variations and modifications may be made without departing from the scope of the invention.

WHAT IS CLAIMED IS

1. A non-linear semiconductor optical device for changing an optical state in response to an irradiation of an incident optical beam, comprising:

a first quantum well layer having discrete quantum levels of carriers, said discrete quantum levels including a first quantum level for electrons and a second quantum level for holes, said first and second quantum levels being separated from each other by an energy gap generally equal to a wavelength of said incident optical beam;

a pair of barrier layers provided above and below said first quantum well layer in contact therewith for defining a potential well in correspondence to said first quantum well layer, said barrier layers having a thickness that allows a tunneling of the carriers therethrough; and a second quantum well layer provided in contact with one of said barrier layers for accepting the carriers that have been created in said first quantum well layer upon excitation by said incident optical beam and escaped from said first quantum well layer by causing the tunneling through said barrier layer;

said second quantum well layer comprising a material that has a conduction band including therein a $\Gamma$ valley and an X valley, wherein said $\Gamma$ valley is located at an energy level substantially higher than said first quantum level while said X valley is located at an energy level substantially lower than said first quantum level.

2. A non-linear semiconductor optical device as claimed in claim 1 in which said first quantum well layer comprises a semiconductor material having a band structure of the direct transition type and selected from a group essentially consisted of GaAs and InGaP.

3. A non-linear semiconductor optical device as claimed in claim 1 in which said second quantum well layer comprises a semiconductor material having a band structure of the indirect transition type and selected from a group essentially consisted of AlAs and GaSbP.

4. A non-linear semiconductor optical device as claimed in claim 1 in which said first quantum well layer comprises AlGaAs having a composition $Al_xGa_{1-x}As$ with a parameter x satisfying a relationship $0 \leq x \leq 0.45$, said barrier layer comprises AlGaAs having a composition $Al_yGa_{1-y}As$ with a parameter y satisfying a relationship $x < y$, and said second quantum well layer comprises AlAs having a composition $Al_zGa_{1-z}As$ with a parameter z satisfying a relationship $y < z \leq 1$.

5. A non-linear semiconductor optical device as claimed in claim 1 in which said first quantum well layer has a composition of $In_{0.48}Ga_{0.52}P$, said barrier layer has a composition of $In_{0.5}(Ga_{1-x}Al_x)_{0.5}P$ with the compositional parameter x set to 0.7, and said second quantum well layer has a composition of $GaSb_{0.31}P_{0.69}$.

6. A non-linear semiconductor optical device as claimed in claim 1 in which said non-linear semiconductor optical device further comprises a substrate having upper and lower major surfaces, wherein said first quantum well layer, said second quantum well layer and said barrier layer are stacked repeatedly to form a layered body having upper and lower major surfaces, said layered body being provided on said substrate, said substrate being provided with an opening that exposes the lower major surface of the layered body.

7. A non-linear semiconductor optical device as claimed in claim 6 in which said non-linear semiconductor optical device further comprises electrode means for eliminating carriers from said first and second quantum well layers by inducing an electric field in said layered body such that the electric field acts in a direction parallel to the first and second quantum well layers.

8. A non-linear semiconductor optical device as claimed in claim 7 in which said electrode means comprises a pair of electrodes provided on the upper major surface of the layered body to oppose with each other across a region of the layered body that is illuminated by the incident optical beam.

9. A non-linear semiconductor optical device as claimed in claim 6 in which said non-linear semiconductor optical device further comprises mask means provided on the upper major surface of the layered body for limiting an area of the layered body that is illuminated by the incident optical beam.

10. A non-linear semiconductor optical device as claimed 9 in which said mask means forms an elongated slit extending in a first direction for passing the incident optical beam, wherein said slit has a width, measured in a second direction perpendicular to said first direction, comparable to or smaller than the wavelength of the incident optical beam, said mask means further including a polarizer for producing an optical beam of which polarization plane extends in the elongating direction of the slit.

11. A non-linear semiconductor optical device as claimed in claim 1 in which said second quantum well layer forms a quantum well of holes with a quantum level formed at an energy level lower than said second quantum level.

12. A non-linear semiconductor optical device for changing an optical property in response to an incident optical beam, comprising:

a substrate having upper and lower major surfaces, said substrate being provided with an opening extending from said upper major surface to said lower major surface in correspondence to an optical path of said incident optical beam;

a layered body having upper and lower major surfaces and provided on said substrate, said layered body comprising an alternate stacking of: a first quantum well layer having a first quantum level for electrons and a second quantum level for holes; and a second quantum well layer having a third quantum level for electrons; said first and second quantum levels being formed in correspondence to a conduction band and a valence band of the first quantum well layer that cause a direct transition of electrons therebetween upon interaction with said incident optical beam; said third quantum level being formed in correspondence to a conduction band that cause an indirect transition of electrons; said second quantum well layer further having a conduction band that causes a direct transition of electrons at an energy level substantially higher than said first quantum level, said third quantum level having an energy substantially lower than said first quantum level; and electrode means provided on the upper major surface of the layered body for removing electrons from the first quantum well layer and for removing holes from the second quantum well layer.

13. An optical resonator supplied with a signal optical beam for establishing an optical resonance therein, comprising:

first and second semi-transparent mirrors provided to oppose with each other with a distance generally equal to an integer multiple of a half-wavelength of said signal optical beam; and a layered body disposed between said first and second mirrors, said layered body comprising: a first quantum well layer having discrete quantum levels of carriers, said discrete quantum levels including a first quantum level for electrons and a second quantum level for holes, said first and second quantum levels being separated from each other by an energy gap generally equal to a wavelength of said signal optical beam; a pair of barrier layers provided above and below said first quantum well layer in contact therewith for defining a potential well in correspondence to said first quantum well layer, said barrier layers having a thickness that allows a tunneling of the carriers therethrough; and a second quantum well layer provided in contact with one of said barrier layers for accepting the carriers that have been created in said first quantum well layer upon excitation by a control optical beam and escaped from said first quantum well layer by causing the tunneling through said barrier layer; said second quantum well layer comprising a material that has a conduction band including therein a $\Gamma$ valley and an X valley, wherein said F valley is located at an energy level substantially higher than said first quantum level while said X valley is located at an energy level substantially lower than said first quantum level.

14. An optical bistable laser diode, comprising:

first and second reflectors provided to oppose with each other with a predetermined distance to form an optical resonator;

an active layer provided between said first and second reflectors, said active layer being injected with electrons and holes for producing an optical beam as a result of a stimulated emission;

a saturable absorption layer provided between said second reflector and said active layer, said saturable absorption layer having a transmittance that changes in response to an optical radiation supplied thereto, said saturable absorption layer comprising:

a first quantum well layer having discrete quantum levels of carriers, said discrete quantum levels including a first quantum level for electrons and a second quantum level for holes, said first and second quantum levels being separated from each other by an energy gap generally equal to a wavelength of said optical radiation; a pair of barrier layers provided above and below said first quantum well layer in contact therewith for defining a potential well in correspondence to said first quantum well layer, said barrier layers having a thickness that allows a tunneling of the carriers therethrough; and a second quantum well layer provided in contact with one of said barrier layers for accepting the carriers that have been created in said first quantum well layer upon excitation by said optical radiation and escaped from said first quantum well layer by causing the tunneling through said barrier layer; said second quantum well layer comprising a material that has a conduction band including therein a $\Gamma$ valley and an X valley, wherein said $\Gamma$ valley is located at an energy level substantially higher than said first quantum level while said X valley is located at an energy level substantially lower than said first quantum level.

* * * * *

UNITED STATES PATENT AND TRADEMARK OFFICE
CERTIFICATE OF CORRECTION

PATENT NO. : 5,225,692
DATED : July 6, 1993
INVENTOR(S) : Atsushi TAKEUCHI et al.

It is certified that error appears in the above-indentified patent and that said Letters Patent is hereby corrected as shown below:

Col. 4, line 63, after "is" insert --a diagram--.

Col. 6, line 53, after "level $E_1$," insert --.--.

Col. 9, line 2, change "16boppose" to --16b oppose--;
line 6, change "16bare" to --16b are--;
line 24, change "16bto" to --16b to--;
line 50, change "16bis" to --16b is--;
line 24, change "16bis" to --16b is--.

Col. 13, line 22, change "$In_{0.5}(Ga_{1-x}Al_x)0.5P$" to --$In_{0.5}(Ga_{1-x}Al_x)_{0.5}P$--.

Signed and Sealed this

Fourth Day of October, 1994

Attest:

BRUCE LEHMAN

Attesting Officer

Commissioner of Patents and Trademarks

UNITED STATES PATENT AND TRADEMARK OFFICE
CERTIFICATE OF CORRECTION

PATENT NO. : 5,225,692
DATED : July 6, 1993
INVENTOR(S) : Atsushi Takeuchi et al It is certified that error appears in the above-indentified patent and that said Letters Patent is hereby corrected as shown below:

On the title page: Item [54] and Column 1, line 1, Title should read

-- "NON-LINEAR SEMICONDUCTOR OPTICAL DEVICE HAVING AN IMPROVED SIGNAL-TO-NOISE RATIO." --

Signed and Sealed this

Twenty-eight Day of March, 1995

Attest:

BRUCE LEHMAN

*Attesting Officer*     *Commissioner of Patents and Trademarks*